(12) United States Patent
Chen

(10) Patent No.: US 9,543,929 B2
(45) Date of Patent: Jan. 10, 2017

(54) APPARATUS AND METHOD FOR OBTAINING POWER VOLTAGE FROM CONTROL SIGNALS

(71) Applicant: RichWave Technology Corp., Taipei (TW)

(72) Inventor: Chih-Sheng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 14/957,610

(22) Filed: Dec. 3, 2015

(65) Prior Publication Data

US 2016/0087609 A1 Mar. 24, 2016

Related U.S. Application Data

(63) Continuation-in-part of application No. 13/345,022, filed on Jan. 6, 2012, now Pat. No. 9,231,578.

(51) Int. Cl.

| H03K 17/687 | (2006.01) |
|---|---|
| H03K 17/60 | (2006.01) |
| G11C 5/14 | (2006.01) |
| H03K 3/012 | (2006.01) |
| H03K 17/00 | (2006.01) |
| H03K 17/693 | (2006.01) |

(52) U.S. Cl.
CPC ............ *H03K 3/012* (2013.01); *H03K 17/007* (2013.01); *H03K 17/687* (2013.01); *H03K 17/693* (2013.01)

(58) Field of Classification Search
CPC .. H03K 17/002; H03K 17/007; H03K 17/735; H03K 17/76

USPC ........................................ 327/427, 430, 530
See application file for complete search history.

(56) References Cited

U.S. PATENT DOCUMENTS

| 3,942,039 | A | 3/1976 | Kikuchi |
|---|---|---|---|
| 5,717,356 | A | 2/1998 | Kohama |
| 7,173,471 | B2 | 2/2007 | Nakatsuka |
| 7,460,852 | B2 | 12/2008 | Burgener |
| 7,796,969 | B2 | 9/2010 | Kelly |
| 8,093,940 | B2 | 1/2012 | Huang |
| 2006/0001473 | A1 | 1/2006 | Yasuda |
| 2011/0254614 | A1 | 10/2011 | Huang |

FOREIGN PATENT DOCUMENTS

| EP | 0720292 | 7/1996 |
|---|---|---|
| EP | 1487103 | 12/2004 |
| JP | 2000223902 | 8/2000 |
| JP | 2001068984 | 3/2001 |
| TW | 200744315 | 12/2007 |
| WO | 2007136050 | 11/2007 |
| WO | 2012070162 | 5/2012 |

*Primary Examiner* — Lincoln Donovan
*Assistant Examiner* — Colleen O Toole
(74) *Attorney, Agent, or Firm* — Winston Hsu; Scott Margo

(57) ABSTRACT

An power voltage generating unit for a radio frequency switch includes a first input and a second input respectively configured to receive a first control signal and a second control signal, wherein the first control signal and the second control signal are configured to control which one of a plurality of paths in the radio frequency switch is enabled, and at least one output, configured to output an auxiliary voltage, derived from at least one of the first control signal or the second control signal, that is used to operate the radio frequency switch. The power voltage may be a voltage used to power an inverting circuit used to enable a selected branch as an isolation branch or shunt branch.

20 Claims, 13 Drawing Sheets

APPARATUS AND METHOD FOR OBTAINING POWER VOLTAGE FROM CONTROL SIGNALS

CROSS REFERENCE TO RELATED APPLICATION

This is a continuation-in-part application of U.S. application Ser. No. 13/345,022, filed on Jan. 6, 2012, which is included herein by reference.

TECHNICAL FIELD

The technical field relates to an apparatus and a method for obtaining power voltage from control signals.

BACKGROUND

Radio frequency (RF) switches are important building blocks in many wired and wireless communication systems. RF switches are found in many different communication devices such as cellular telephones, wireless pagers, wireless infrastructure equipment, satellite communications equipment, and cable television equipment. As is well known, the performance of RF switches may be characterized by one of any number operating performance parameters including insertion loss and switch isolation. Performance parameters are often tightly coupled, and any one parameter can be emphasized in the design of RF switch components at the expense of others. Other characteristics that are important in RF switch design include ease and degree (or level) of integration of the RF switch, complexity, yield, return loss and, of course, cost of manufacture.

FIG. 5 shows a pseudomorphic High Electron Mobility Transistor (pHEMT) RF switch 500 according to the prior art. The RF switch 500 includes an RF common (RFC) input node 501 and two RF output nodes 502, 503. Coupling/DC blocking capacitors are also shown at each of the RFC input node 501 and the RF output nodes 502, 503 but are ignored for purposes of the instant description. Those skilled in the art will appreciate that such capacitors impede the passage of DC current, yet do not appreciably impact an AC signal.

As further shown, several transistors M51, M52, M53, and M54 are arranged to effect RF communication between the RFC input node 501 and the RF output node 502, or between the RFC input node 501 and the RF output node 503. Specifically, the transistor M51 is arranged between the RFC input node 501 and the RF output node 502, the transistor M52 is arranged between the RF output node 502 and ground, the transistor M53 is arranged between the RFC input node 501 and the RF output node 503, and the transistor M54 is arranged between the RF output node 503 and ground. Each of the transistors M51-M54 includes by-pass resistors (which are not labeled with reference numerals) connected between respective drain and source terminals.

Two control signals VC1 and VC2 applied, respectively, to the gates of the transistors M51 and M53 control which path (the RFC input node 501 to the RF output node 502 or the RFC input node 501 to the RF output node 503) will be taken by an RF AC signal input at the RFC input node 501. In the configuration shown, the control signal VC1 is 3.3V, which turns the transistor M51 on. The control signal VC2 is 0V, which turns the transistor M53 off. In this configuration, the RF path is configured to be the RFC input node 501 to the RF output node 502. The transistors M52 and M54 operate to enable either an isolation branch or a shunt branch depending on which path (the RFC input node 501 to the RF output node 502 or the RFC input node 501 to the RF output node 503) is selected. That is, when the control signal VC1 is high (3.3V), a control signal VC1B applied to the gate of the transistor M52 is controlled to be low, e.g., 0V. With the control signal VC1B low, the transistor M52 is off thereby isolating the path between the RFC input node 501 and the RF output node 502. Meanwhile, a control signal VC2B is set high or equal to the control signal VC1 thus turning the transistor M54 on and creating an AC signal shunt path between the RF output node 503 and ground to ensure that no signal (or very little) is present at the RF output node 503 when the RF output node 503 is not selected to output the AC signal received at the RFC input node 501. As shown in FIG. 5, the several control signals VC1, VC1B, VC2, and VC2B are applied via respective resistors (which are also not labeled with reference numerals).

For high power operation for the RF switch 500 shown in FIG. 5, a voltage of a node 525 must be high enough to not only make the transistor M51 forward biased with a positive Vgs over drive (the control signal VC1–"the voltage at the node 525) to reduce turn-on insertion loss, but also to maintain sufficient reverse bias of the transistor M52 (0–"the voltage at the node 525") to avoid turn-on during high power voltage swings.

For a depletion pHEMT device, threshold voltage (Vth) is about −1V. Due to the relatively large leakage current in a pHEMT device, two back-to-back diodes 520, 521 form a Kirchoff Voltage Law (KVL) node. Specifically, with the control signal VC1=3.3 voltage, the drop across the diode 520 is approximately 0.7V, which causes a voltage of 2.6V to be present at the node 525. With a voltage of 2.6V at the node 525, Vgs for the transistor M52 (which is reversed biased) is 0V−2.6V, or −2.6V. The point here is that as a result of the leakage current, the node 525 is set at 2.6V which is suitable for handling high power RF switch operations, and as a result, no auxiliary biasing is needed to support a high power RF switch implemented with pHEMT devices.

Unlike pHEMT device-based RF switches, silicon-based RF switches permit much less leakage current. As such, silicon-based RF switches operating in high power scenarios require special biasing circuitry and voltages to operate properly. There is accordingly a need to provide cost effective ways of providing such biasing circuitry and voltages in silicon-based RF switching devices.

SUMMARY

An embodiment of the present invention provides a voltage generating unit for a radio frequency switch. The voltage generating unit includes a first input, a second input, and a first output. The first input is configured to receive a first control signal. The second input is configured to receive a second control signal, wherein the first control signal and the second control signal are configured to control which one of a plurality of paths in the radio frequency switch is enabled. The first and second inputs are coupled to the first output through respective first and second voltage drop circuits, and a first power voltage and a second power voltage based on the first and second control signals are derived from the first output. The first power voltage and the second power voltage are configured to power first and second inverting circuits of first and second switch paths of the plurality of paths respectively, and the first and second inverting circuits receive and invert respective ones of the first and second control signals.

Another embodiment of the present invention provides a radio frequency (RF) switch. The RF switch includes an RF common terminal, a first RF output, a second RF output, a first semiconductor switching device, a second semiconductor switching device, first and second branches, first and second inverting circuits, and a voltage generating unit, wherein the voltage generating unit includes first and second inputs, and a first output. The first semiconductor switching device is controlled by a first control signal and disposed between the RF common terminal and the first RF output in a first path of the RF switch. The second semiconductor switching device is controlled by a second control signal and disposed between the RF common terminal and the second RF output in a second path of the RF switch. The first and second branches are connected to the first and second paths, respectively, including third and fourth semiconductor switching devices, respectively. The first and second inverting circuits have respective outputs connected to respective control terminals of the third and fourth switching devices. The first and second inputs receive the first and second control signals, respectively. The first output is coupled to the first and second inputs through respective first and second voltage drop circuits, and a first power voltage and a second power voltage based on the first and second control signals are derived from the first output. The first power voltage and the second power voltage are configured to power the first and second inverting circuits of the first and second branches, respectively, and the first and second inverting circuits receive and invert respective ones of the first and second control signals.

Another embodiment of the present invention provides a method of generating one or more voltages used to operate a radio frequency switch. The method includes receiving at first and second inputs respective first and second control signals that are used to enable first and second paths of the radio frequency switch, respectively; coupling the first and second inputs to a first output through respective first and second voltage drop circuits such that a first power voltage and a second power voltage based on the first and second control signals are derived from the first output; and powering first and second inverting circuits respectively by the first power voltage and the second power voltage; wherein the first and second inverting circuits supply first and second inverted versions of the first and second control signals, respectively, to first and second branches of the radio frequency switch, respectively.

DETAILED DESCRIPTION

Figure 1:
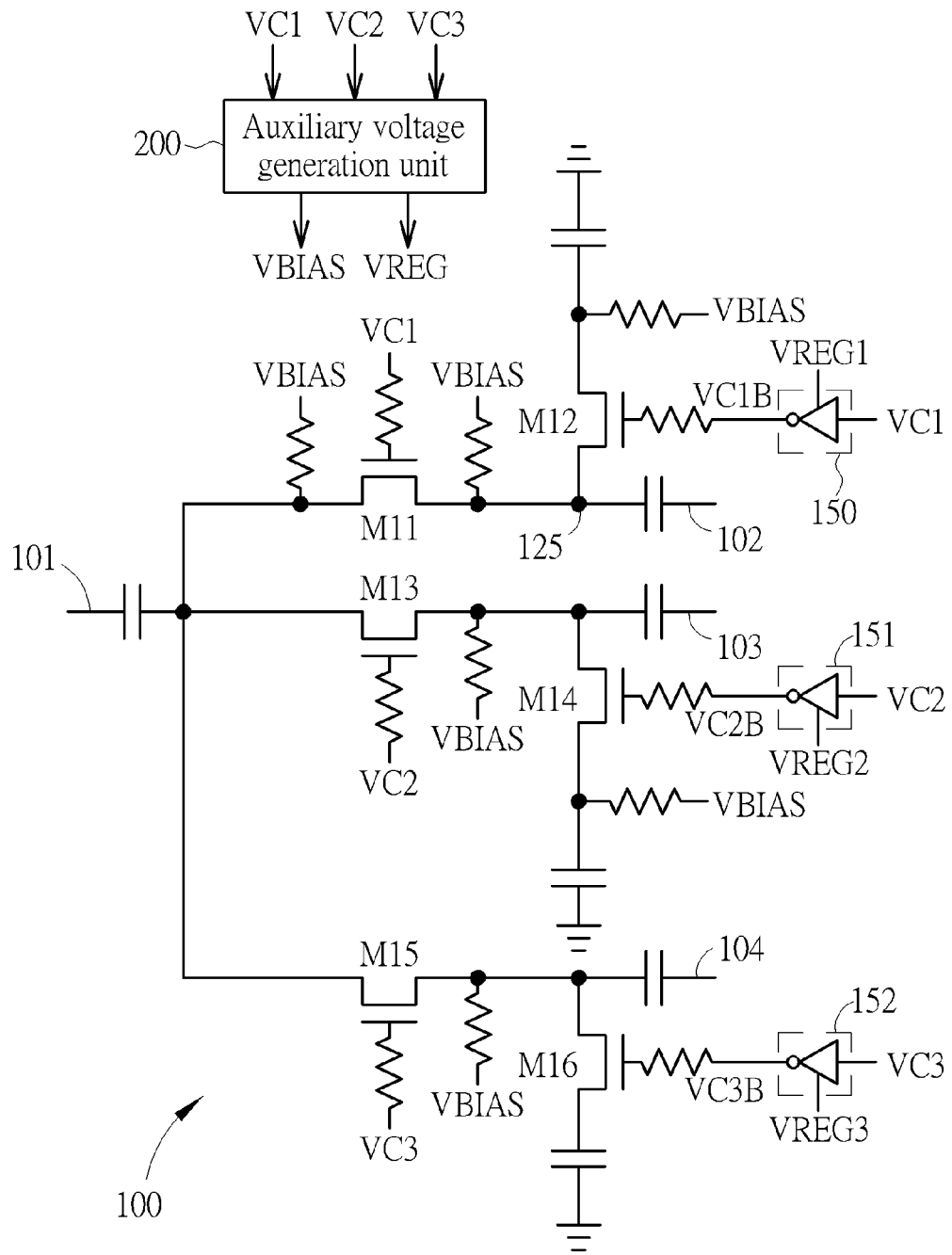
FIG. 1 depicts a silicon based transistor RF switch configured as a single pole triple throw switch according to an embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Reference is now made to FIG. 1, which depicts a silicon based transistor RF switch 100 configured as a single pole triple throw switch. With such the RF switch 100, three RF paths may be defined from an RFC input node 101, a path from the RFC input node 101 to an RF output node 102, a path from the RFC input node 101 to an RF output node 103, and a path from the RFC input node 101 to an RF output node 104.

Figure 5:
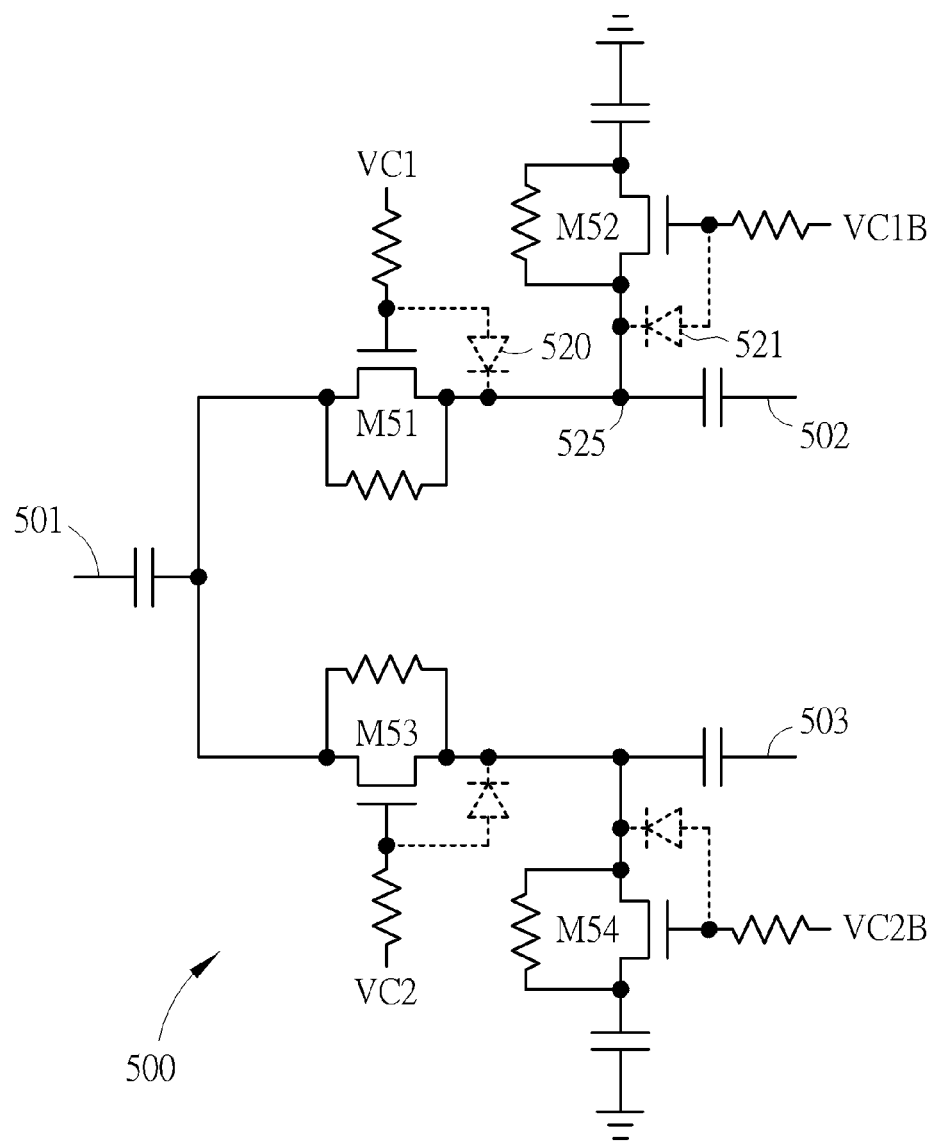
FIG. 5 shows a pseudomorphic High Electron Mobility Transistor RF switch according to the prior art.

In the RF switch 100, as in the RF switch 500, several transistors are employed to control which path is enabled and thereby permit an RF signal to pass. In the case of the RF switch 100, transistors M11, M13 and M15 are employed as the main path controllers, while transistors M12, M14 and M16 are controlled to isolate a given path or to enable an AC shunt path for non-selected pathways. Unlike the RF switch 500 shown in FIG. 5, however, the transistors M11-M16 in the RF switch 100 are silicon-based transistors.

The following table shows control signals VC1, VC2, VC3 that are employed to control the RF switch 100. Corresponding control signals VC1B, VC2B, and VC3B are arranged to be the inverse of the control signals VC1, VC2, and VC3 by passing the control signals VC1, VC2, and VC3 through appropriate inverting circuits 150-152, wherein each of the inverting circuits 150-152 includes an inverter. However, in another embodiment of the present invention, each of the inverting circuits 150-152 includes odd number of inverters connected in series or other circuits which can invert a corresponding control signal of the control signals VC1, VC2, VC3.

| states | VC1 | VC2 | VC3 |
| --- | --- | --- | --- |
| RFC-RF1 | 3.3 | 0 | 0 |
| RFC-RF2 | 0 | 3.3 | 0 |
| RFC-RF3 | 0 | 0 | 3.3 |

More specifically, to have an RF signal pass from the RFC input node 101 to the RF output node 102, for example, the control signal VC1 is set high and the control signals VC2 and VC3 are set low. To have an RF signal pass from the RFC input node 101 to the RF output node 103, the control signal VC2 is set high and the control signals VC1 and VC3 are set low. And, to have an RF signal pass from the RFC input node 101 to the RF output node 104, the control signal VC3 is set to high and the control signals VC2 and VC1 are set low.

In silicon based transistors, gate leakage current is typically very small. Thus, the voltage at a node 125 (shown in the top path of the RF switch 100 between the RFC input node 101 and the RF output node 102) will almost always be close to 0V since, e.g., the bypass resistor disposed across the transistor M12 is connected to ground via a DC blocking capacitor, wherein the node 125 is used as an example, and those skilled in the art will appreciate that the discussion herein applies equally to corresponding nodes in the other branches of the RF switch 100. However, if the node 125 is maintained at 0V DC, the RF switch 100 does not operate well in high power scenarios. Just as in the pHEMT implementation of FIG. 5, the node 125 is preferably set at a higher voltage than 0V to ensure forward biasing of the transistor M11 and reverse biasing of the transistor M12 (in the case of the top branch of the RF switch 100).

To obtain the desired voltage at the node 125 and support high power operations of the RF switch 100, a separate voltage source is employed to apply a bias voltage, namely "VBIAS," to multiple nodes in each branch and path of the RF switch 100. Taking the top branch or path as an example, a bias voltage VBIAS is applied between the RFC input node 101 and the transistor M11, at the node 125, and between the transistor M12 and ground. The bias voltage VBIAS may be on the order of 1.6V or higher. When the bias voltage VBIAS is applied in this manner, the entire segment of the switch, including its respective path, isolation and shunt branches are biased to the level of the applied bias voltage VBIAS. As a result, the RF switch 100 can properly operate in high power scenarios.

In addition (and not shown in FIG. 5), the inverting circuits 150-152 must be powered to supply the control signals VC1B, VC2B and VC3B to operate the isolation and shunt branches. In FIG. 1, each of the inverting circuits 150-152 includes a power node, an input and an output, wherein the power node is configured to receive a supply power, the input is configured to receive a control signal, and the output is configured to output an inverse of the control signal. Supply powers for inverting circuits 150-152 are provided by a power voltage labeled "VREG1-VREG3", respectively. The outputs of the inverting circuits 150-152 are the inverse of the control signals VC1, VC2, VC3, resulting in the control signals VC1B, VC2B and VC3B, which are supplied to the appropriate shunt/isolation branch of each path of the RF switch 100.

In accordance with an embodiment of the present invention, and as further shown in FIG. 1, an auxiliary voltage generation unit 200 is provided. As will be explained below, the auxiliary voltage generation unit 200 can be fabricated as part of the switch circuitry itself. The auxiliary voltage generation unit 200 receives the control signals VC1, VC2, VC3 (or however many control signals there may be) and generates from at least one of the control signals VC1, VC2, VC3 appropriate voltages for the bias voltage VBIAS and power voltages VREG1-VREG3 that are then employed as described above. In one embodiment, the bias voltage VBIAS is about 1.6V and the power voltages VREG1-VREG3 are about 2.6V.

Figure 2A:
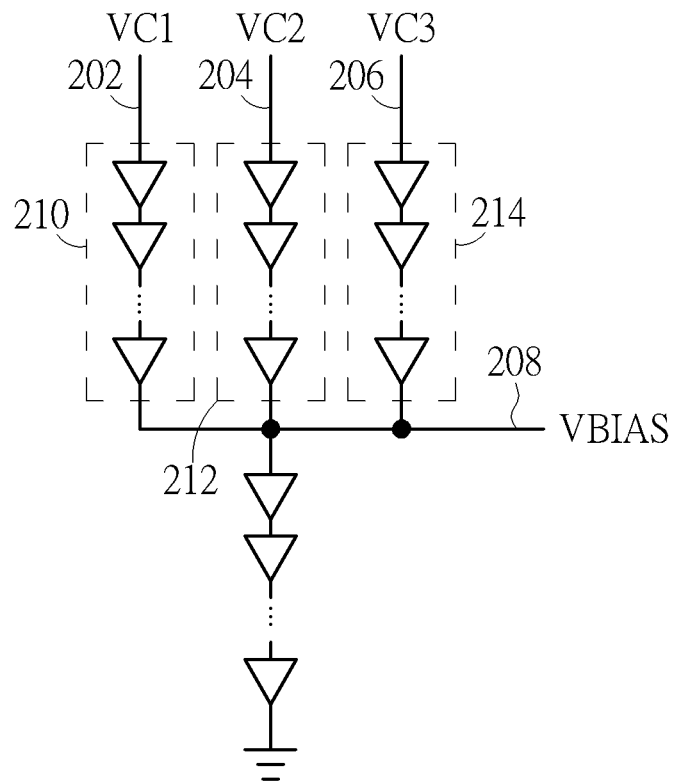
FIGS. 2A-2I show possible embodiments of the internal circuitry of the auxiliary voltage generation unit according to embodiments of the present invention.

FIGS. 2A-2I show possible embodiments of the internal circuitry of the auxiliary voltage generation unit 200. In FIG. 2A, for example, first, second, and third inputs 202, 204, 206 are coupled to an output 208 through respective voltage drop circuits 210, 212, 214 such that the bias voltage VBIAS based on one of the control signals VC1, VC2, VC3 is generated at the output 208, wherein the first, second, and third inputs 202, 204, 206 are used for receiving the control signals VC1, VC2, VC3, and each of the voltage drop circuits 210, 212, 214 includes the same amount of diodes. As shown in FIG. 2A, assuming the control signal VC1 is 3.3V and the control signals VC2 and VC3 are 0V, then the voltage drop circuits 210, 212, 214 can provide the desired bias voltage VBIAS level according to one of the control signals VC1, VC2, VC3.

Figure 2B:
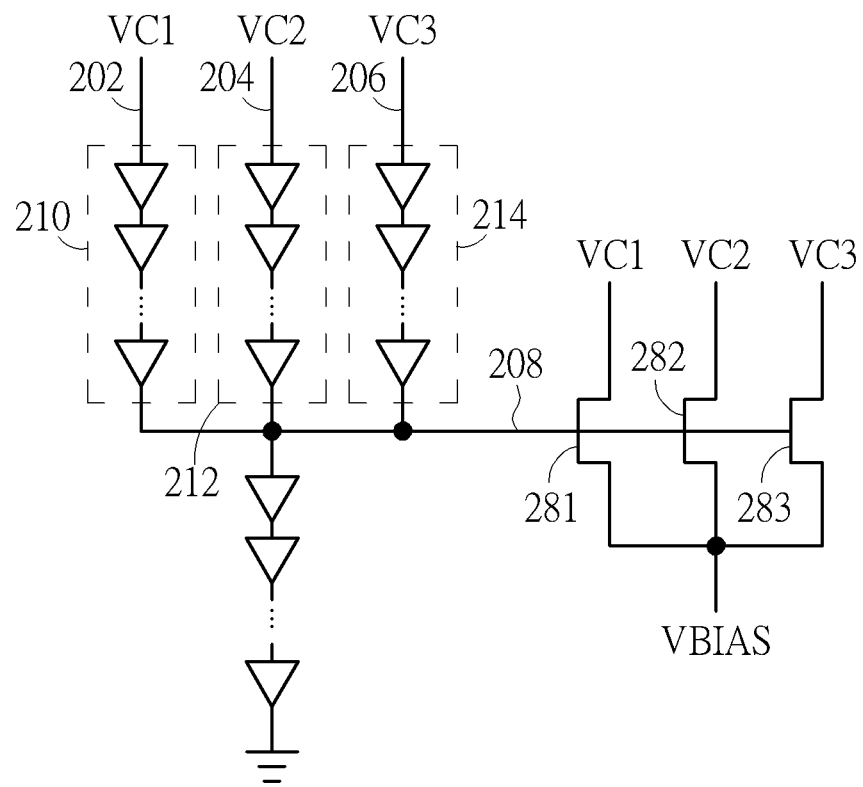

FIG. 2B shows another embodiment similar to that shown in FIG. 2A, but further includes transistors 281-283 configured as source followers that are arranged to be turned on by application of a voltage from the diode-implemented voltage divider and to have drain nodes connected, respectively, to the control signals VC1, VC2, VC3, wherein the transistors 281-283 are coupled to the voltage drop circuits 210, 212, 214 through the output 208. Thus, one of the transistors 281-283 will always supply the bias voltage VBIAS since one of the control signals VC1, VC2 or VC3 is always high. In the case of a switch with more than three branches, additional control signals VC4, ... , VCn can be added to the auxiliary voltage generation unit 200 shown in FIG. 2B, such that there is always at least one "high" control signal that can supply power for the bias voltage VBIAS.

The diodes included in the voltage drop circuits 210, 212, 214 may be formed any number of ways including with stand alone p-n junctions, N-type Metal-oxide-semiconductor (NMOS) or P-type Metal-oxide-semiconductor (PMOS) transistors connected to operate as diodes, or bipolar transistors connected to operate as diodes, and the transistors 281-283 can be native MOS or standard MOS to enhance sourcing current capability. Such devices can be formed in a same semiconductor substrate in which the RF switch 100 is fabricated, resulting in reduced manufacturing costs.

Figure 2C:
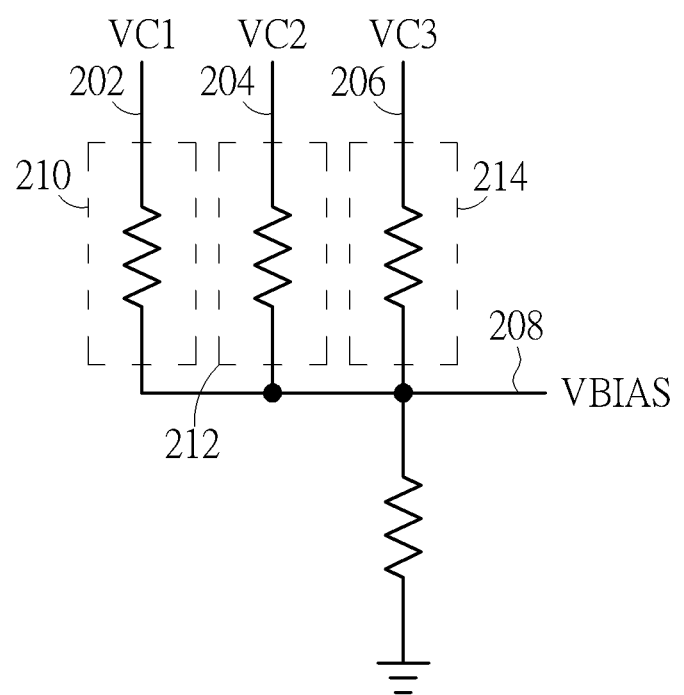

FIG. 2C shows another possible embodiment to supply the bias voltage VBIAS. As shown in FIG. 2C, each of the voltage drop circuits 210, 212, 214 includes at least one series resistor, so that the bias voltage VBIAS is obtained from the output 208 according to one of the control signals VC1, VC2, VC3 through the voltage drop circuits 210, 212, 214 shown in FIG. 2C. In addition, those skilled in the art will appreciate that the values of the at least one series resistor can be selected to obtain the desired voltage level for the bias voltage VBIAS.

Figure 2D:
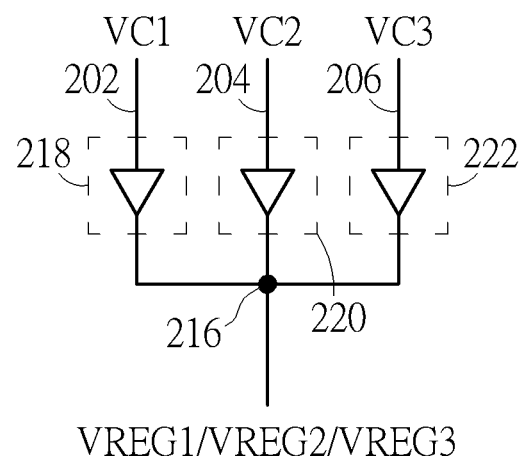

FIG. 2D shows a possible embodiment of circuitry within the auxiliary voltage generation unit 200 to generate the power voltages VREG1-VREG3. In FIG. 2D, the first, second, and third inputs 202, 204, 206 are coupled to a first output 216 through respective voltage drop circuits 218, 220, 222 such that the power voltages VREG1-VREG3 based on one of the control signals VC1, VC2, VC3 are generated at the first output 216, wherein the voltage drop circuits 218, 220, 222 include diodes 295-297, respectively, and the power voltages VREG1-VREG3 have the same voltage value. In addition, the voltage drop circuits 218, 220, 222 are configured to reduce voltage levels of the control signals VC1, VC2, VC3, respectively.

Consequently, when one of the control signals VC1, VC2, VC3 is high, a voltage drop occurs across one of the voltage drop circuits 218, 220, 222 and the desired power voltages VREG1-VREG3 can be obtained. Thus, for example, with the control signals VC1, VC2, VC3 on the order of 3.3V, the power voltages VREG1-VREG3 will be 3.3V−0.7V=2.6V, which is sufficient to power the inverting circuits 150-152 shown in FIG. 1.

Figure 2E:
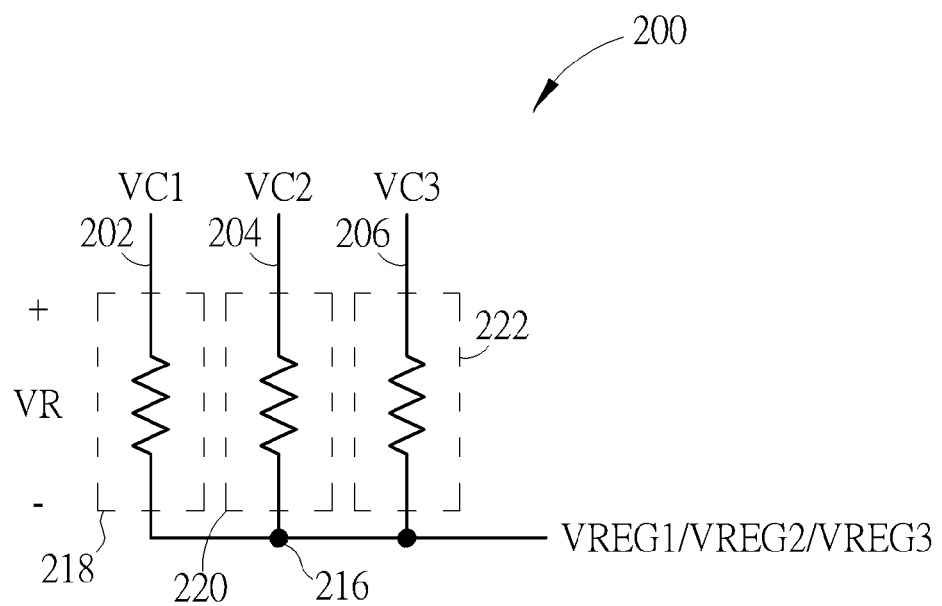

FIG. 2E shows another possible embodiment to supply the power voltages VREG1-VREG3. As shown in FIG. 2E, each of the voltage drop circuits 218, 220, 222 includes at least one series resistor, so that the power voltages VREG1-VREG3 are generated at the first output 216 according to one of the control signals VC1, VC2, VC3 through the voltage drop circuits 218, 220, 222 shown in FIG. 2E, wherein the voltage drop circuits 218, 220, 222 are configured to reduce voltage levels of the control signals VC1, VC2, VC3, respectively, and the power voltages VREG1-VREG3 have the same voltage value. For example, the power voltages VREG1-VREG3 may be calculated as VREG1=VREG2=VREG3=VC1−VR, VREG1=VREG2=VREG3=VC2−VR, or VREG1=VREG2=VREG3=VC3−VR, wherein VR is a voltage drop across the voltage drop circuits 218, 220, 222. In addition, those skilled in the art will appreciate that the values of the at least one series resistor can be selected to obtain the desired power voltages VREG1-VREG3.

Figure 2F:
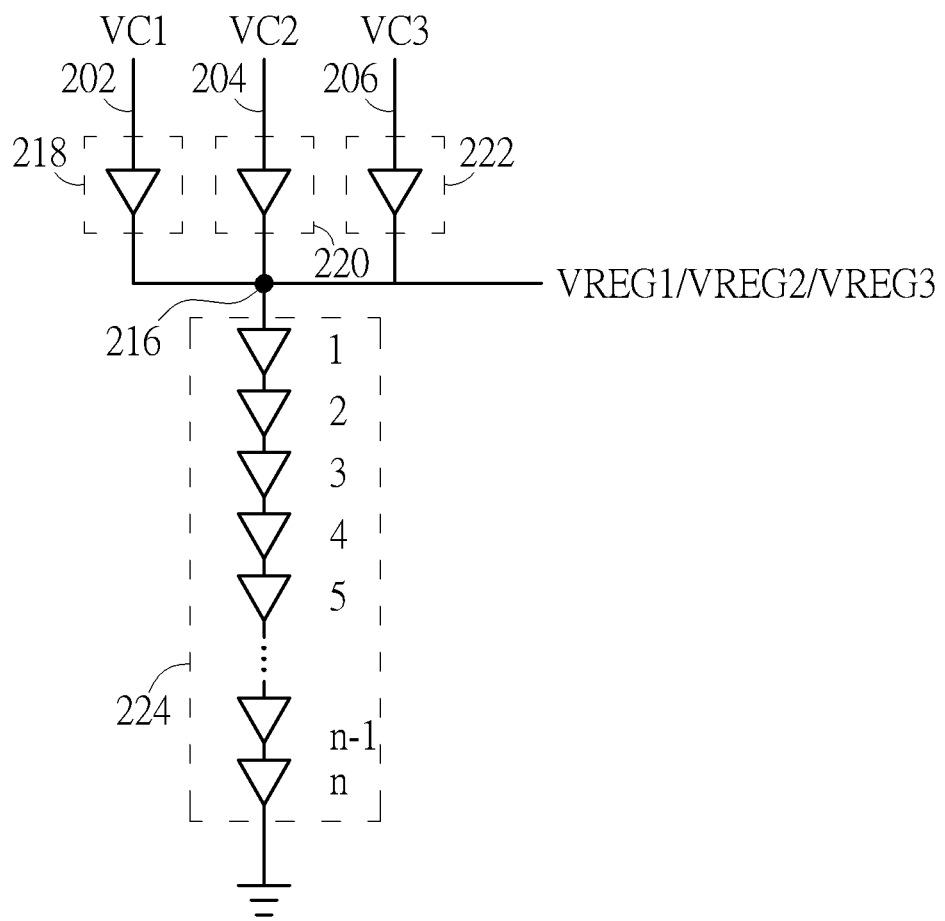

FIG. 2F shows another possible embodiment of circuitry to generate the power voltages VREG1-VREG3. As shown in FIG. 2F, a difference between the embodiment in FIG. 2D and the embodiment in FIG. 2F is that the auxiliary voltage generation unit 200 further includes a voltage drop circuit 224 including a plurality of diodes 1 to n, so the power voltages VREG1-VREG3 can be obtained via the voltage drop circuit 224, wherein the voltage drop circuit 224 is coupled between the first output 216 and a reference potential (such as ground). Therefore, as shown in FIG. 2F, the power voltages VREG1-VREG3 may be calculated as VREG1=VREG2=VREG3=VC1*n/(n+1), VREG1=VREG2=VREG3=VC2*n/(n+1), or VREG1=VREG2=VREG3=VC3*n/(n+1), wherein the power voltages VREG1-VREG3 have the same voltage value.

Figure 2G:
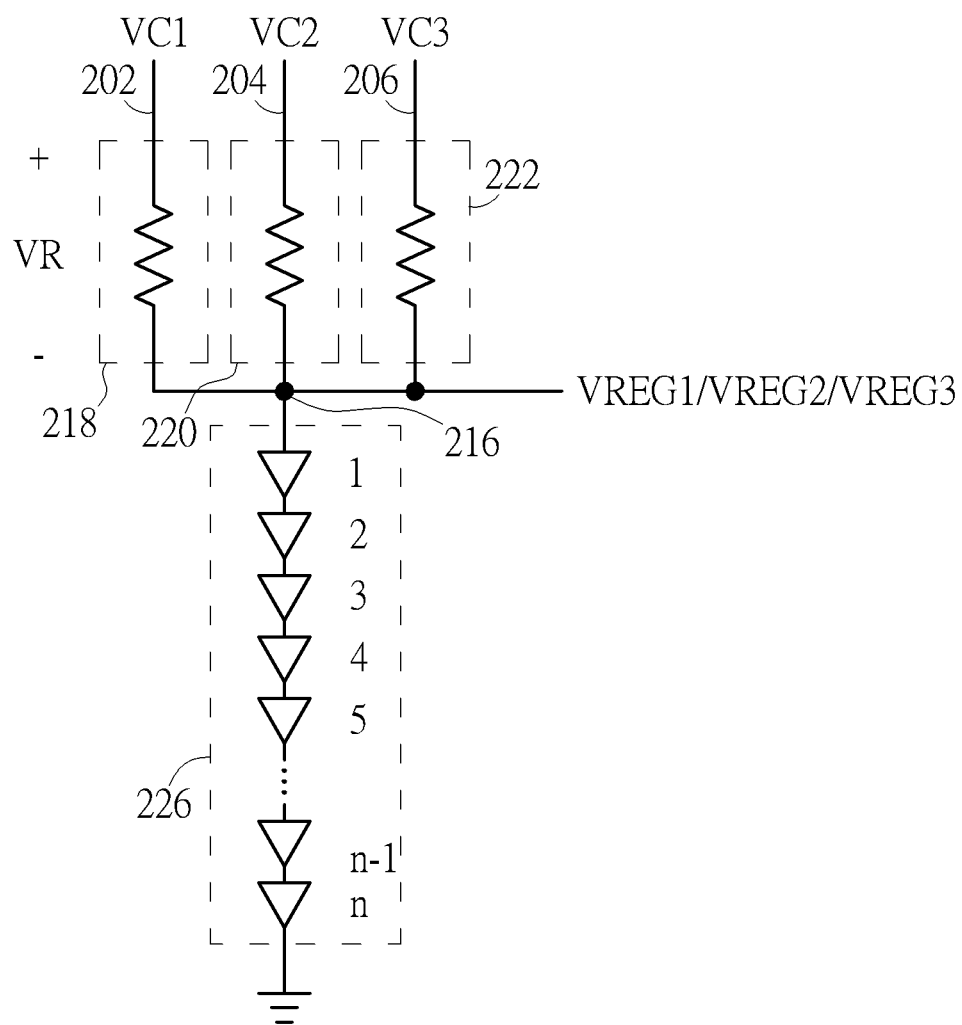

FIG. 2G shows another possible embodiment of circuitry to generate the power voltages VREG1-VREG3. As shown in FIG. 2G, a difference between the embodiment in FIG. 2E and the embodiment in FIG. 2G is that the auxiliary voltage generation unit 200 further includes a voltage drop circuit 226 including a plurality of diodes 1 to n. In addition, the power voltages VREG1-VREG3 can be obtained at the first output 216 according to one of the control signals VC1, VC2, VC3 through the voltage drop circuits 218, 220, 222, wherein operational principles of the voltage drop circuit 226 are identical to those of the voltage drop circuit 224, so further description thereof is omitted for simplicity.

Figure 2H:
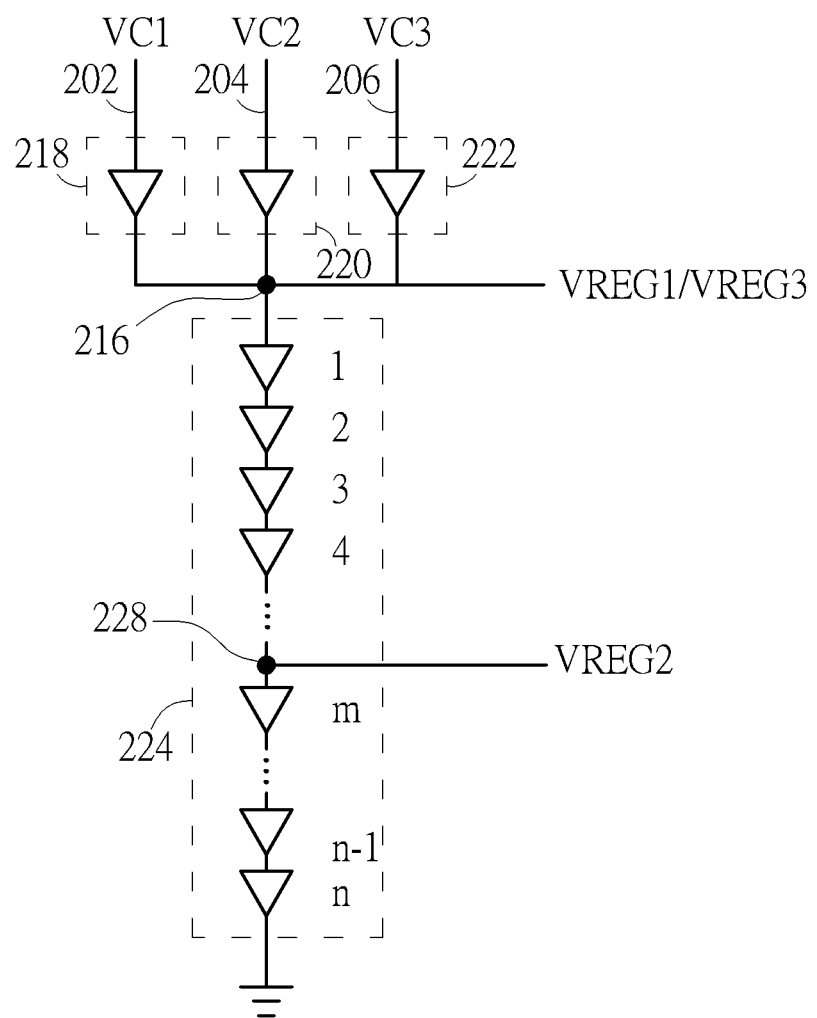

FIG. 2H shows another possible embodiment of circuitry to generate the power voltages VREG1-VREG3. As shown in FIG. 2H, a difference between the embodiment in FIG. 2H and the embodiment in FIG. 2F is that the auxiliary voltage generation unit 200 further includes a second output 228, wherein the second output 228 is coupled to the first output 216 through a terminal of a diode of the voltage drop circuit 224 (e.g. an $m^{th}$ diode of the voltage drop circuit 224) such that the power voltage VRGE2 based on the power voltage VRGE1 is generated at the second output 228, wherein VREG2=VCk*m/(n+1), and m is less than n, and VCk is equal to the control signal VC1, the control signal VC2, or the control signal VC3. Therefore, the power voltage VRGE2 is different from the power voltage VRGE1. In addition, in one embodiment of the present invention, the power voltage VRGE3 is generated at the first output 216 (that is, the power voltage VRGE3 is equal to the power voltage VRGE1). However, in another embodiment of the present invention, the power voltage VRGE3 is generated at the second output 228 (that is, the power voltage VRGE3 is different from the power voltage VRGE1, but is equal to the power voltage VRGE2). In addition, subsequent operational principles of the embodiment in FIG. 2H are identical to those of the embodiment in FIG. 2F, so further description thereof is omitted for simplicity.

Figure 2I:
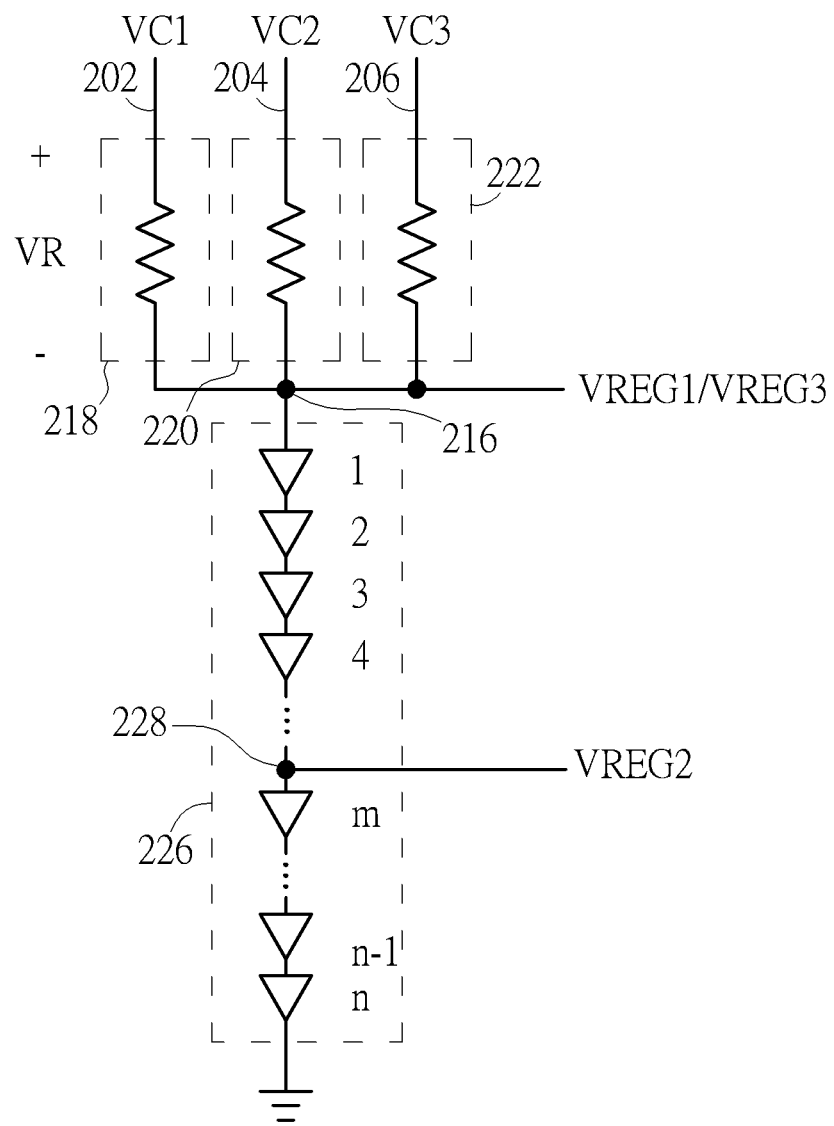

FIG. 2I shows another possible embodiment of circuitry to generate the power voltages VREG1-VREG3. As shown in FIG. 2I, a difference between the embodiment in FIG. 2I and the embodiment in FIG. 2G is that the auxiliary voltage generation unit 200 further includes a second output 228, wherein the second output 228 is coupled to the first output 216 through a terminal of a diode of the voltage drop circuit 226 (e.g. an $m^{th}$ diode of the voltage drop circuit 226) such that the power voltage VRGE2 based on the power voltage VRGE1 is generated at the second output 228, wherein VREG2=(VCk−VR)*m/(n), and m is less than n, and VCk is equal to the control signal VC1, the control signal VC2, or the control signal VC3. Therefore, the power voltage VRGE2 is different from the power voltage VRGE1. In addition, in one embodiment of the present invention, the power voltage VRGE3 is generated at the first output 216 (that is, the power voltage VRGE3 is equal to the power voltage VRGE1). However, in another embodiment of the present invention, the power voltage VRGE3 is generated at the second output 228 (that is, the power voltage VRGE3 is different from the power voltage VRGE1, but is equal to the power voltage VRGE2). In addition, subsequent operational principles of the embodiment in FIG. 2I are identical to those of the embodiment in FIG. 2G, so further description thereof is omitted for simplicity.

Based on the forgoing, those skilled in the art will appreciate that embodiments of the present invention enable a silicon-based RF switch that is capable of operating in high power scenarios without the need for external voltages to obtain the bias voltage VBIAS and/or the power voltages VREG1-VREG3 for proper operation. In accordance with embodiments of the present invention, the bias voltage VBIAS and the power voltages VREG1-VREG3 are obtained directly from control signals (e.g., VC1, VC2, . . . , VCn) that are used to control which path of the switch an RF signal is to take from an RF common or input node to an output node. The control signals (e.g., VC1, VC2, . . . , VCn), for instance, are pins that might be found on an RF switch implemented as an integrated circuit. Without the need for yet more pins to supply the bias voltage VBIAS and/or the power voltages VREG1-VREG3, the packaging and overall circuit layout of such an integrated circuit can be simplified, resulting in reduced cost.

Figure 3:
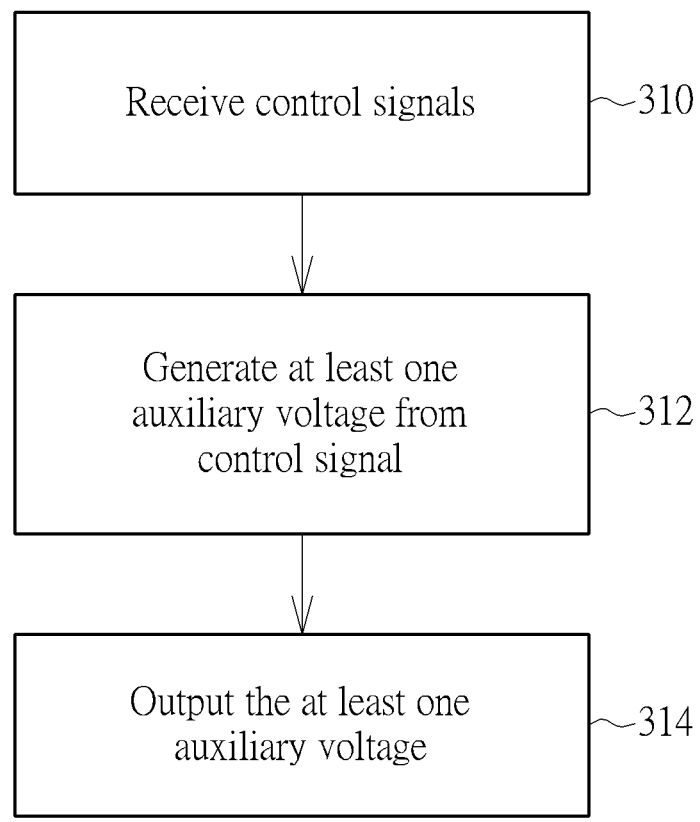
FIGS. 3, 4 depict a series of operations that may be performed according to embodiments of the present invention.

FIG. 3 depicts a series of operations that may be performed in accordance with an embodiment of the present invention. Reference may also be made to FIG. 1, and in particular, the auxiliary voltage generation unit 200 in connection with the explanation of FIG. 3. At 310, control signals are received. These signals may be, for instance, the control signals that are used to enable a selected path/branch of an RF switch. In the discussion above, such control signals might correspond to, e.g., the control signals VC1, VC2, etc. At 312, at least one auxiliary voltage is generated from at least one of the control signals. In the implementations described above, the auxiliary voltage could be the bias voltage VBIAS used to bias one or more paths/branches of the RF switch 100, and/or the power voltages VREG1-VREG3 used to power the inverting circuits 150-152 used to obtain the control signals VC1B, VC2B, VC3B. At 314, the at least one auxiliary voltage is output.

Figure 4:
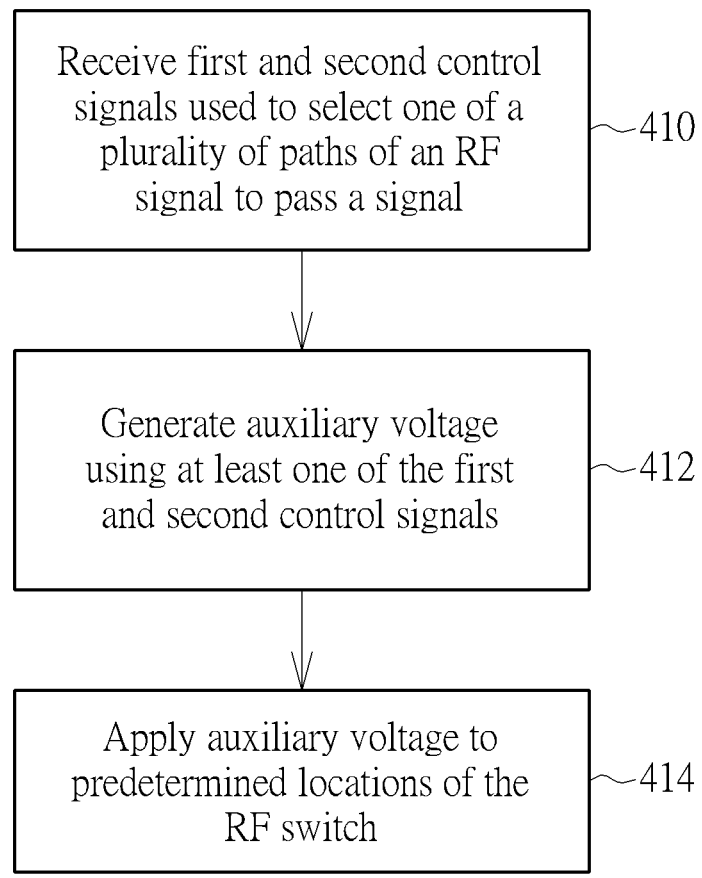

FIG. 4 depicts yet another series of operations that may be performed in accordance with an embodiment of the present invention. At 410, the control signals VC1-VC3 are applied to paths of the RF switch 100 to select one of a plurality of paths via which to pass an RF signal. At 412, at least one auxiliary voltage is generated using at least one of the control signals VC1-VC3. And, at 414, the at least one auxiliary voltage is applied to predetermined nodes of the RF switch 100.

As those skilled in the art will appreciate, the auxiliary voltages may be the bias voltage that is applied to maintain certain nodes along respective branches of the RF switch at a voltage level sufficient to sustain high power operation, or the auxiliary voltages may be the power voltages, wherein one of the power voltages may be used to power an inverting circuit which is used to invert the control signals to enable isolation or shunt branches within the RF switch. In either case, by generating such auxiliary voltages using control signals, it is possible to simplify the design of, e.g., a silicon-based RF switch. That is, no separate, external-supplied the bias voltage and the power voltages are needed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage generating unit for a radio frequency switch, comprising:
a first input configured to receive a first control signal;
a second input configured to receive a second control signal, wherein the first control signal and the second control signal are configured to control which one of a plurality of paths in the radio frequency switch is enabled; and
a first output, wherein the first and second inputs are coupled to the first output through respective first and second voltage drop circuits, and a first power voltage and a second power voltage based on the first and second control signals are derived from the first output;
wherein:
the first power voltage and the second power voltage are configured to power first and second inverting circuits of first and second switch paths of the plurality of paths respectively; and
the first and second inverting circuits receive and invert respective ones of the first and second control signals.

2. The voltage generating unit of claim 1, wherein the first power voltage is equal to the second power voltage.

3. The voltage generating unit of claim 1, further comprising:
a third voltage drop circuit coupled between the first output and a reference potential.

4. The voltage generating unit of claim 3, further comprising:
a second output, wherein the second output is coupled to the first output through the third voltage drop circuit such that the second power voltage based on the first power voltage is generated at the second output, and the first power voltage is different from the second power voltage.

5. The voltage generating unit of claim 1, further comprising:
a circuit comprising diodes configured to reduce a voltage level of the first or the second control signal.

6. The voltage generating unit of claim 5, wherein the diodes are configured to operate as the first and second voltage drop circuits.

7. The voltage generating unit of claim 1, wherein:
the first voltage drop circuit includes a first diode, connected between the first input and the first output, wherein the first voltage drop circuit is configured to reduce a voltage level of the first control signal; and
the second voltage drop circuit includes a second diode, connected between the second input and the first output, wherein the second voltage drop circuit is configured to reduce a voltage level of the second control signal.

8. The voltage generating unit of claim 1, wherein:
the first voltage drop circuit includes a first resistor, connected between the first input and the first output, wherein the first voltage drop circuit is configured to reduce a voltage level of the first control signal; and
the second voltage drop circuit includes a second resistor, wherein the second voltage drop circuit is connected between the second input and the first output, configured to reduce a voltage level of the second control signal.

9. A radio frequency (RF) switch, comprising:
an RF common terminal, a first RF output, and a second RF output;
a first semiconductor switching device controlled by a first control signal and disposed between the RF common terminal and the first RF output in a first path of the RF switch;
a second semiconductor switching device controlled by a second control signal and disposed between the RF common terminal and the second RF output in a second path of the RF switch;
first and second branches, connected to the first and second paths, respectively, comprising third and fourth semiconductor switching devices, respectively;
first and second inverting circuits having respective outputs connected to respective control terminals of the third and fourth switching devices; and
a voltage generating unit comprising first and second inputs to receive the first and second control signals, respectively, and a first output coupled to the first and second inputs through respective first and second voltage drop circuits, and a first power voltage and a second power voltage based on the first and second control signals are derived from the first output;
wherein:
the first power voltage and the second power voltage are configured to power the first and second inverting circuits of the first and second branches, respectively; and
the first and second inverting circuits receive and invert respective ones of the first and second control signals.

10. The RF switch of claim 9, wherein the first power voltage is equal to the second power voltage.

11. The RF switch of claim 9, wherein the voltage generating unit further comprises:
a third voltage drop circuit coupled between the first output and a reference potential.

12. The RF switch of claim 11, wherein the voltage generating unit further comprises:
a second output, wherein the second output is coupled to the first output through the third voltage drop circuit such that the second power voltage based on the first power voltage is generated at the second output, and the first power voltage is different from the second power voltage.

13. The RF switch of claim 9, wherein the voltage generating unit comprises a plurality of diodes.

14. The RF switch of claim 13, wherein the plurality of diodes are configured to operate as the first and second voltage drop circuits.

15. The RF switch of claim 9, wherein the voltage generating unit comprises a plurality of resistors.

16. The RF switch of claim 15, wherein the plurality of resistors are configured to operate as the first and second voltage drop circuits.

17. The RF switch of claim 9, wherein:
the first inverting circuit further includes a power node, an input and an output, the power node is configured to receive the first power voltage, the input is configured to receive the first control signal, and the output is configured to output an inverse of the first control signal; and the second inverting circuit further includes a power node, an input and an output, the power node is configured to receive the second power voltage, the input is configured to receive the second control signal, and the output is configured to output an inverse of the second control signal.

18. A method of generating one or more voltages used to operate a radio frequency switch, comprising:

receiving at first and second inputs respective first and second control signals that are used to enable first and second paths of the radio frequency switch, respectively;

coupling the first and second inputs to a first output through respective first and second voltage drop circuits such that a first power voltage and a second power voltage based on the first and second control signals are derived from the first output; and powering first and second inverting circuits respectively by the first power voltage and the second power voltage;

wherein the first and second inverting circuits supply first and second inverted versions of the first and second control signals, respectively, to first and second branches of the radio frequency switch, respectively.

19. The method of claim 18, wherein the first power voltage is equal to the second power voltage.

20. The method of claim 18, further comprising:

coupling the first output to a second output through a third voltage drop circuit such that the second power voltage based on the first power voltage is generated at the second output, and the first power voltage is different from the second power voltage.

* * * * *